(12) United States Patent
Melman

(10) Patent No.: US 9,760,009 B2
(45) Date of Patent: Sep. 12, 2017

(54) CROSS-LINKED POLYMER BASED HYDROGEL MATERIAL COMPOSITIONS, METHODS AND APPLICATIONS

(75) Inventor: Artem Melman, Potsdam, NY (US)

(73) Assignee: CLARKSON UNIVERSITY, Postdam, NY (US)

( * ) Notice: Subject to any disclaimer, the term of this patent is extended or adjusted under 35 U.S.C. 154(b) by 73 days.

(21) Appl. No.: 13/470,943

(22) Filed: May 14, 2012

(65) Prior Publication Data

US 2012/0288479 A1    Nov. 15, 2012

Related U.S. Application Data

(60) Provisional application No. 61/485,686, filed on May 13, 2011.

(51) Int. Cl.

| | | |
|---|---|---|
| C08L 5/04 | (2006.01) |
| B05D 3/04 | (2006.01) |
| G03F 7/20 | (2006.01) |
| C25D 9/04 | (2006.01) |
| A61K 35/00 | (2006.01) |
| A61K 35/76 | (2015.01) |
| G03F 7/26 | (2006.01) |
| C08B 37/00 | (2006.01) |
| C08L 5/06 | (2006.01) |
| C08L 5/08 | (2006.01) |
| C25D 9/06 | (2006.01) |
| C23C 18/14 | (2006.01) |
| G03F 7/004 | (2006.01) |
| G03F 7/039 | (2006.01) |

(52) U.S. Cl.
CPC .......... *G03F 7/265* (2013.01); *C08B 37/0039* (2013.01); *C08B 37/0045* (2013.01); *C08B 37/0069* (2013.01); *C08L 5/04* (2013.01); *C08L 5/06* (2013.01); *C08L 5/08* (2013.01); *C23C 18/14* (2013.01); *C25D 9/06* (2013.01); *G03F 7/0043* (2013.01); *G03F 7/039* (2013.01); *G03F 7/203* (2013.01)

(58) Field of Classification Search
None
See application file for complete search history.

(56) References Cited

U.S. PATENT DOCUMENTS

| 6,333,194 B1 * | 12/2001 | Levy et al. .................. 435/450 |
| 2004/0176557 A1 * | 9/2004 | Mertens et al. ........... 526/328.5 |
| 2006/0240071 A1 * | 10/2006 | Lerner et al. ................. 424/426 |
| 2008/0085295 A1 * | 4/2008 | Melvik et al. ................ 424/423 |
| 2010/0234233 A1 * | 9/2010 | Sannino et al. .............. 504/360 |

OTHER PUBLICATIONS

Sano et al. "In vitro adhesion of human dermal fibroblasts on iron cross-linked alginate films" Biomed. Mater. 4 (2009).*
Rowley et al.; Alginate hydrogels as synthetic extracellular matrix materials; 1998 Elsevier Science Ltd.; Biomaterials 20; 1999; pp. 45-53.
Machida-Sano et al.; In vitro adhesion of human dermal fibroblasts on iron cross-linked alginate films; 2009 IOP Publishing Ltd.; Biomedical Mater 4 025008; 2009; pp. 1-8.
Augst et al.; Alginate Hydrogels as Biomaterials; Macromolecular Bioscience 2006, 6, pp. 623-633.

* cited by examiner

*Primary Examiner* — Robert A Wax
*Assistant Examiner* — Danah Al-Awadi
(74) *Attorney, Agent, or Firm* — Bond Schoeneck & King, PLLC; George McGuire; Blaine Bettinger

(57) ABSTRACT

A hydrogel material composition includes: (1) an alginate (or other cross-linking polymer) material; (2) an optional α-hydroxy carboxylate material; and (3) an iron cation material. The hydrogel material composition with or without the α-hydroxy-carboxylate material may be used in a photolithographic imaging application or a photorelease application within the context of a photoirradiation induced reduction/oxidation reaction of an iron (III) cation material to form an iron (II) cation material.

6 Claims, 4 Drawing Sheets

CROSS-LINKED POLYMER BASED HYDROGEL MATERIAL COMPOSITIONS, METHODS AND APPLICATIONS

CROSS-REFERENCE TO RELATED APPLICATION

This application is related to, and derives priority from, U.S. Provisional Patent Application Ser. No. 61/485,686, filed 13 May 2011, and titled Responsive Biocompatible Alginate Hydrogels, the content of which provisional patent application is incorporated herein fully by reference.

BACKGROUND OF THE INVENTION

1. Field of the Invention

Embodiments relate generally to hydrogel material compositions, methods and applications. More particularly, embodiments relate to cross-linked polymer based hydrogel material compositions, methods and applications.

2. Description of the Related Art

Alginates are a family of linear polysaccharides derived from brown marine algae. Alginates are composed of 1,4-linked residues of β-D-mannuronic acid and α-L-guluronic acid in varying amounts. Alginates have useful properties, such as but not limited to the formation of complexes with certain M (II) (i.e., $M^{2+}$) and M (III) (i.e., $M^{3+}$) metal cations that cross-link polysaccharide chains, thus producing stable hydrogel material compositions. The most commonly used calcium (II) cross-linked alginate hydrogel material composition is used for encapsulation of drugs, cells and tissues, as well as for wound dressing applications and other applications. Iron (III) cross-linked alginate hydrogel material compositions have also been proposed for analogous biomedical applications such as drug encapsulation Like calcium (II) cross-linked alginate hydrogel material compositions, iron (III) alginate hydrogel material compositions are biocompatible and possess an additional advantage of superior cell adhesion, making iron (III) alginate hydrogel material compositions suitable as a cell support scaffold for cell cultures.

Since alginate hydrogel material compositions comprise biologically compatible material compositions and biologically significant material compositions, desirable are: (1) alginate hydrogel material compositions and related hydrogel material compositions; (2) alginate hydrogel material methods and related hydrogel material methods; and (3) alginate hydrogel material applications and related hydrogel material applications, that enhance utility of alginate hydrogel material compositions and related hydrogel material compositions.

SUMMARY OF THE INVENTION

Embodiments relate to: (1) iron cation cross-linked alginate (and related cross-linking polymer) hydrogel material compositions; (2) methods for preparing the iron cation cross-linked alginate (and related cross-linking polymer) hydrogel material compositions; and (3) photoinduced dissolution and photolithographic application methods that use the iron cation cross-linked alginate (and related cross-linking polymer) hydrogel material compositions. The foregoing iron cation cross-linked alginate (and related cross-linking polymer) hydrogel material compositions when cross-linked with an iron (III) cation are susceptible to photoinduced dissolution and photolithographic patterning by exposure to radiation in the visible and ultraviolet region that effects a reduction/oxidation (i.e., redox) reaction. The reduction/oxidation reaction reduces the iron (III) cation cross-linked alginate (or related cross-linking polymer) hydrogel material composition to an iron (II) cation cross-linked alginate (or related cross-linking polymer) hydrogel material composition that is water soluble (i.e., and thus aqueous solution reducible or developable) in comparison with the iron (III) cation cross-linked alginate (or related cross-linking polymer) hydrogel material composition, thus providing for dissolution or patterning of the iron (III) cation cross-linked alginate (or related cross-linking polymer) hydrogel material composition while using a photoirradiation method or a photolithographic method.

By analogy, it is anticipated that other related cross-linking polymer materials in addition to alginate polymer materials may be susceptible to cross-linking with an iron (III) cation that is further susceptible to a reduction/oxidation reaction to provide a material composition that is photoirradiation dissolvable, photolithographically imageable and photolithographically patternable. Such other anticipated related cross-linking polymer materials are discussed in further detail below.

A particular material composition in accordance with the embodiments includes a cross-linking polymer material. This particular material composition also includes an α-hydroxy-carboxylate material. This particular material composition also includes an iron cation material.

Another particular material composition in accordance with the embodiments includes an alginate polymer material. This other particular material composition also includes an α-hydroxy-carboxylate material. This other particular material composition also includes an iron cation material.

A particular method for preparing a material composition in accordance with the embodiments includes mixing together at least a cross-linking polymer material and an iron (II) cation material to provide a precursor composition. The method also includes oxidizing the iron (II) cation material within the precursor composition to provide an iron (III) cation material within a final composition comprising the cross-linking polymer material and the iron (III) cation material.

A particular photoirradiation method in accordance with the embodiments includes photoirradiating at least one portion of a hydrogel material composition comprising: (1) a cross-linking polymer material; and (2) an iron (III) cation material, to provide a photoirradiated portion of the hydrogel material composition comprising an iron (II) cation material, where the photoirradiated portion of the hydrogel material composition is more soluble in a solvent than a non-photoirradiated portion of the hydrogel material composition comprising the iron (III) cation material.

Another particular photoirradiation method in accordance with the embodiments includes selectively photoirradiating at least one portion of a hydrogel material composition layer formed over a substrate and comprising: (1) a cross-linking polymer material; and (2) an iron (III) cation material, to provide a photoirradiated portion of the hydrogel material composition layer comprising an iron (II) cation material formed over the substrate, where the photoirradiated portion of the hydrogel material composition layer is more soluble in a solvent than a non-photoirradiated portion of the hydrogel material composition comprising the iron (III) cation material layer.

BRIEF DESCRIPTION OF THE DRAWINGS

The objects, features and advantages of the embodiments are understood within the context of the Detailed Description of the Embodiments, as set forth below. The Detailed Description of the Embodiments is understood within the context of the accompanying drawings, that form a material part of this disclosure, wherein.

DETAILED DESCRIPTION OF THE EMBODIMENTS

Embodiments relate to: (1) iron cation cross-linked alginate (and related cross-linking polymer) hydrogel material compositions; (2) methods for preparing the iron cation cross-linked alginate (and related cross-linking polymer) hydrogel material compositions; and (3) photoirradiation and photolithographic application methods that use the iron cation cross-linked alginate (and related cross-linking polymer) hydrogel material compositions.

Embodiments are predicated upon an ability of alginate and other cross-linking polymer complexes of iron (III) cations to undergo a photoirradiation induced reduction/oxidation (i.e., redox) reaction in which a cross-linking polymer (or an added reductant material) is oxidized, and an iron (III) cation is reduced. During this reduction/oxidation process the cross-linking polymer (i.e., an alginate polymer, for example), may serve as a weak reductant. This particular reduction/oxidation process may be substantially accelerated by the addition of certain carboxylic acids or carboxylic acid derivatives that may serve as more effective reductants in the presence of a photoirradiated iron (III) cation.

While not limiting the embodiments or the invention, it is anticipated that the process of photoirradiation of the iron (III) cation in the presence of a suitable reductant results in conversion of the iron (III) cation into an iron (II) cation. The iron (II) cation is comparatively weakly bound by carboxylate groups of the alginate (or cross-linking groups of a related cross-linking polymer) hydrogel material composition, and that particular portion of the iron (II) cation cross-linked alginate (or related cross-linking polymer) hydrogel material composition may be developed (i.e., dissolved) with water or an aqueous solution such as but not limited to an aqueous buffer solution, thus resulting in complete or partial dissolution of a hydrogel material composition that comprises an iron (III) alginate (or other cross-linking polymer) hydrogel material composition. The processes of the photoinduced reduction of an iron (III) cation to an iron (II) cation in the presence of a suitable reductant and the resulting dissolution of the iron (II) hydrogel material composition may be effected simultaneously, or alternatively dissolution of a photoirradiated iron (III) alginate (or other cross-linking polymer) hydrogel material composition may be undertaken independent of the photoirradiation and related reduction/oxidation process step.

I. MATERIALS CONSIDERATIONS FOR PREPARING IRON (III) ALGINATE (OR RELATED CROSS-LINKING POLYMER) HYDROGEL MATERIAL COMPOSITION IN ACCORDANCE WITH THE EMBODIMENTS

Figure 1:
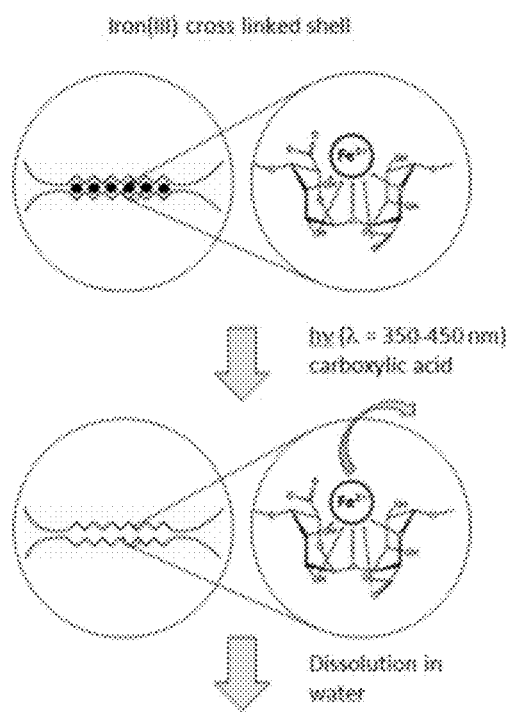
FIG. 1 shows a plurality of chemical schematic diagrams illustrating a mechanism of photoirradiation induced reduction of an iron (III) cation within an iron (III) cation cross-linked alginate hydrogel material composition resulting in dissolution of an iron cation cross-linked alginate hydrogel material composition in accordance with the embodiments.

As a reference and as a starting point, FIG. 1 shows a chemical schematic diagram of an iron (III) cation cross-linking mechanism with respect to an alginate hydrogel material composition. As is illustrated within the chemical schematic diagram of FIG. 1 at the top portion, an iron (III) cation cross-links different polymer chains of an alginate polymer material to provide a hydrogel material composition. Upon irradiation with light radiation in the 350 to 450 nanometer range that may be absorbed by the iron (III) cation, and under circumstances where the alginate polymer material or any other independently added molecule provides a donor electron, the iron (III) cation is chemically reduced and alginate hydrogel material composition is transformed into an iron (II) alginate hydrogel material composition, and with such a photoinduced reduction the iron (II) to algininate bond is more labile in comparison with the iron (III) to alginate bond. For that reason a photoirradiated portion, but not a non-photoirradiated portion, of the iron (III) cation alginate hydrogel material composition becomes soluble in an aqueous developer, such as but not limited to water or an aqueous buffer solution.

Figure 2:
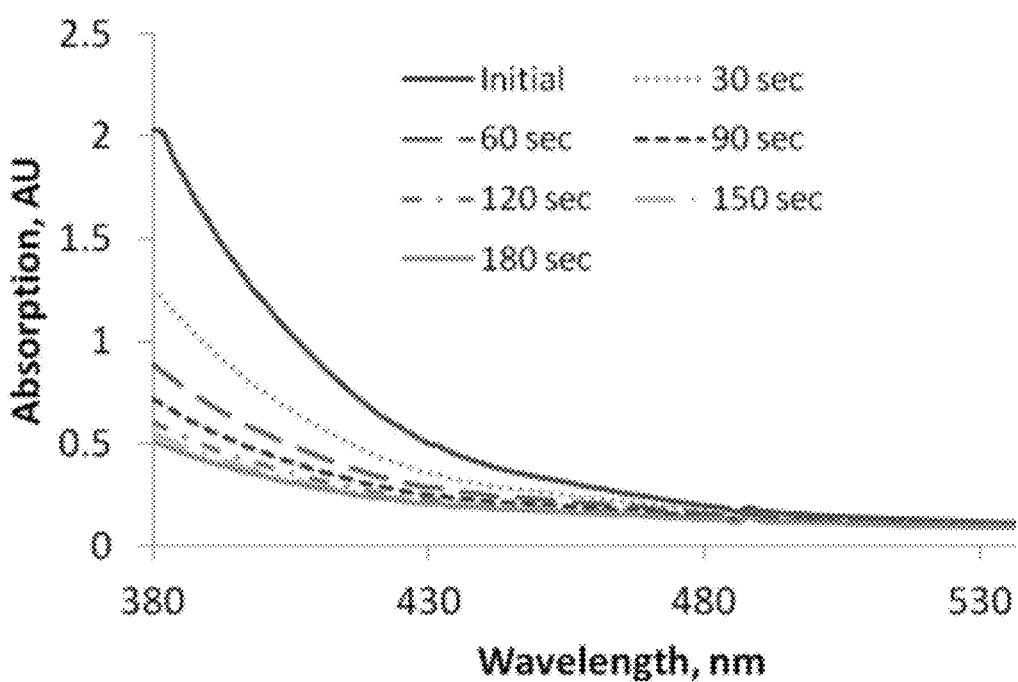
FIG. 2 shows a UV-visible absorption spectrum of Absorption versus Wavelength as a function of time corresponding with photoinduced reduction of an iron (III) cation within an iron (III) cation cross-linked hydrogel material composition in accordance with the chemical schematic diagrams of FIG. 1.

For further reference purposes, FIG. 2 shows a UV-visible spectrum of Absorption versus Wavelength as a function of photoirradiation time for an iron (III) cation cross-linked alginate hydrogel material composition that correlates with the chemical structure schematic diagram of FIG. 1. The UV-visible spectrum of FIG. 2 is directed towards photoirradiation of an iron (III) cation cross-linked alginate hydrogel material composition in 20 mM lactic acid using 405 nanometer UV-visible photoirradiation wavelength light with an intensity of 41 mW per square centimeter.

Desirable within the context of the embodiments is that the process of a photoirradiation induced solubility increase of iron (III) cation cross-linked alginate hydrogel material compositions allows release of materials and component objects that may have previously been incorporated and entrapped within the iron (III) alginate (or other cross-linking polymer) hydrogel material compositions, or alternatively attached to a surface of the iron (III) cation cross-linked alginate (or other cross-linking polymer) hydrogel material compositions. Such materials and components may include, but are not necessarily limited to, nanoparticles of various compositions, small molecules with molecular weight below about 1000 daltons, polymers and biopolymers such as but not limited to proteins and ribonucleic acids, cellular organelles, whole livings cells, cell colonies, fragments of tissues and whole tissues.

Application of appropriate wavelength light irradiation to a portion of the photoirradiation induced degradable alginate (or other cross-linking polymer) hydrogel material composition allows partial and selective degradation of the hydrogel material composition in portions that are photoirradiated and thus affected by the photoirradiation light. This allows subsequent selective removal of the hydrogel material composition and localized release of materials and components with two and three dimensional shape directed to or influenced by the photoirradiation light. Such selective application of photoirradiation light may be effected by the passing of such incident photoirradiation light, which is typically in the visible or ultraviolet wavelength range, through a suitable mask. Alternatively, such selective application of photoirradiation light may be effected by moving a more narrowly shaped and focused photoirradiation light beam from a laser photoirradiation light source or another photoirradiation light source with respect to an iron (III) cation cross-linked alginate (or other cross-linking polymer) hydrogel material composition.

In light of the foregoing description, a hydrogel material composition in accordance with the embodiments thus comprises: (1) an alginate polymer material or a related cross-linking polymer material; (2) an optional α-hydroxy-carboxylate material; and (3) an iron cation material.

With respect to the alginate polymer material, the embodiments contemplate use of alginate polymer materials having: (1) a molecular weight from about 10,000 to about 600,000 daltons and preferably from about 50,000 to about 500,000 daltons; and (2) a mannuronate to guluronate molar ratio from about 0.4 to about 2, and preferably from about 1 to about 1.5.

Within the context of cross-linking polymer materials other than alginate cross-linking polymer materials, the embodiments anticipate and intend selection of base cross-linking polymer materials other than alginate cross-linking polymer materials, but with similar physical and chemical properties as described above. Within the context of this limitation, such other cross-linking polymer materials other than alginate cross-linking polymer materials may include, but are not necessarily limited to polyacrylate, polyvinyl alcohol, agarose, carboxymethyl chitin, and pectin cross-linking polymer materials. Such other cross-linking polymer materials may also desirably chelate a metal cation, such as an iron (III) cation, while using carboxylate chemical functionality, but such is not intended to limit the embodiments.

With respect to the optional α-hydroxy-carboxylate material which is intended as a small molecule material rather than a polymer material, the embodiments contemplate use of α-hydroxy-carboxylate materials including but not limited to lactic acid, methoxyacetic acid, mandelic acid, tartaric acid, citric acid, malic acid, mandelic acid, gluconic acid, 2-hydrobutanoic acid, 2-hydroxypentanoic acid, 2-hydroxy-4-pentenoic acid, 2-hydroxyhexanoic acid, 2-hydroxybutanedioic acid, 2-hydroxyundecanoic acid, pentonic acid, hexonic acid and related α-hydroxy-carboxylate materials.

With respect to the iron cation material, the embodiments contemplate use of iron cation materials including but not limited to iron (II) cation materials and iron (III) cation materials which may include any of several types and chemical composition of anions for purposes of electrical neutrality. Such anions may include, but are not necessarily limited to chloride, fluoride, nitrate, phosphate and sulfate anions.

With respect to particular hydrogel material compositions comprising the foregoing three base material components and a remainder component comprising water: (1) the alginate (or other cross-linking polymer) material typically comprises from about 1 to about 4 weight percent, and more typically from about 1 to about 1.5 weight percent, of the total of the foregoing three base material components and the water component; (2) the optional α-hydroxy-carboxylic acid molecule material typically comprises from about 0.5 to about 10 weight percent, and more preferably from about 1 to about 2 weight percent, of the total of the foregoing three base material components and the water component; and (3) the iron cation material typically comprises from about 0.5 to about 5 weight percent, and more preferably from about 1 to about 2 weight percent, of the foregoing three base material components and the water component.

As noted above, the alginate (or other cross-linking polymer) hydrogel material composition in accordance with the embodiments may also include biologically active materials such as but not limited to viruses, cells and bipopolymers. As well, the alginate (or other cross-linking polymer) hydrogel material composition in accordance with the embodiments may also include biologically inert materials, such as but not limited to filler materials, colorant materials, surfactant materials, viscosity modifying materials and related materials as are known in the relevant art. When present, these added materials may be included at a concentration range from about 0.001 to about 50 weight percent, and more preferably from about 0.1 to about 2 weight percent, of the foregoing three base material components and the water component (or alternatively of the total of all material components including the water component) within the hydrogel material composition.

II. METHOD FOR PREPARING AN ALGINATE (OR OTHER CROSS-LINKING POLYMER) HYDROGEL MATERIAL COMPOSITION IN ACCORDANCE WITH THE EMBODIMENTS

In accordance with the embodiments, any and all of the foregoing three base material components in conjunction with any and all of the foregoing additional components may simply be mixed together in an aqueous solution while using an iron (III) cation base material to provide a hydrogel material composition in accordance with the embodiments.

Alternatively, the embodiments also contemplate that one may start with the same base material composition components as described above in an aqueous solution, but with an iron (II) cation material rather than an iron (III) cation material. Under these circumstances one may subsequently oxidize the hydrogel material composition to include an iron (III) cation material prior to use. This particular approach to hydrogel material composition preparation in accordance with the embodiments provides value under circumstances where a hydrogel material composition is otherwise susceptible to a dark reaction that provides for spontaneous reduction of an iron (III) cation material component to an iron (II) cation material component at an undesirably high rate. Under such circumstances, the requisite oxidation of the starting iron (II) cation material component to the needed iron (III) cation material component may be effected either before or after further processing (i.e., coating) of the hydrogel material composition. Within the context of the embodiments, oxidation under exposure to air or any oxygen containing gas mixture is generally intended as sufficient to oxidize an iron (II) cation material to an iron (III) cation material within the context of a hydrogel material composition in accordance with the embodiments.

Figure 3:
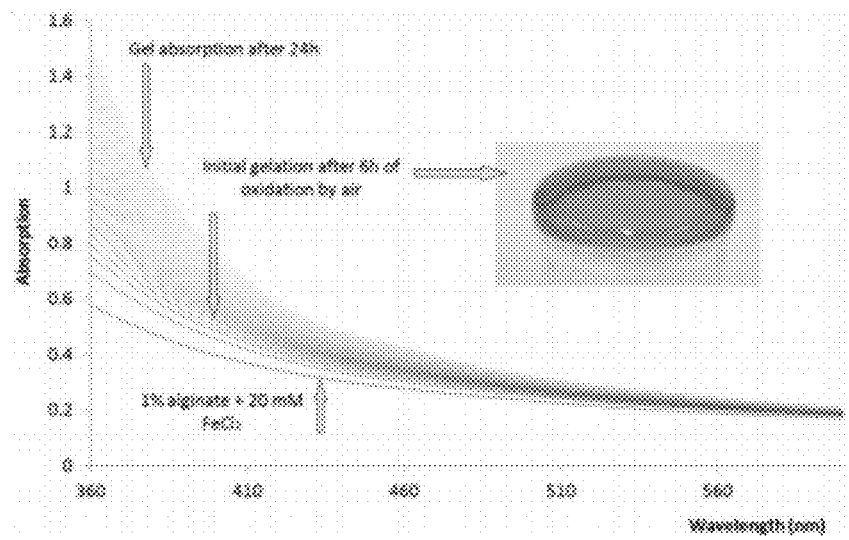
FIG. 3 shows a UV-visible absorption spectrum of Absorption versus Wavelength as a function of time corresponding with air oxidation of an iron (II) cation alginate hydrogel material composition in accordance with the embodiments to provide an iron (III) cation cross-linked alginate hydrogel material composition in accordance with the embodiments.

With respect to such air oxidation of such an iron (II) cation material to such an iron (III) cation material within the context of a hydrogel material composition in accordance with the embodiments, FIG. 3 shows a UV-visible spectrum of Absorption versus Wavelength as a function of air oxidation time for a 4 millimeter thick layer of a solution of 1% sodium alginate and 20 mmol/L iron (II) chloride. The data curves that are illustrated within the UV-visible spectrum of FIG. 3 indicate initial gellation of the iron (II) alginate solution at about 6 hours to form an iron (III) cross-linked alginate hydrogel material composition, with further increases in absorption up to at least about 24 hours suggesting and indicating continued and more complete oxidation of iron (II) cation material to iron (III) cation material.

III. PHOTOLITHOGRAPHIC METHODS USING THE HYDROGEL MATERIAL COMPOSITION IN ACCORDANCE WITH THE EMBODIMENTS

Beyond the hydrogel material composition in accordance with the embodiments and the methods for preparing the hydrogel material composition in accordance with the embodiments, the embodiments also contemplate photoirradiation methods including photolithographic methods that use the hydrogel material composition in accordance with the embodiments. In that regard, FIG. 4 shows a series of process flow schematic cross-sectional diagrams illustrating the results of progressive stages in photolithographically forming a patterned hydrogel material composition layer in accordance with the embodiments.

Figure 4:
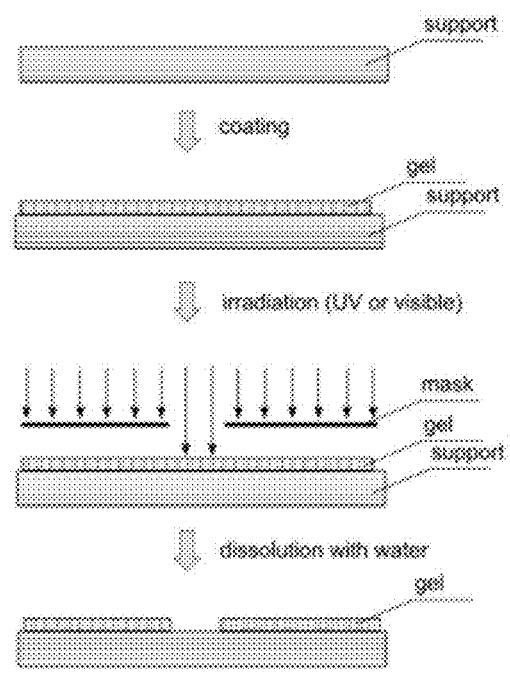
FIG. 4 shows a series of schematic cross-sectional diagrams illustrating the results of progressive process stages in photolithographically patterning an iron (III) cation cross-linked alginate hydrogel material composition in accordance with the embodiments.

In that regard, the uppermost diagram within the schematic cross-sectional diagrams within FIG. 4 shows a substrate support. The substrate support may comprise any of several materials as may be conventional within the context of an application which is intended to utilize the substrate support and the hydrogel material composition in accordance with the embodiments. Such applications may include, but are not necessarily limited to biochemical applications, biotechnological applications, microelectronic applications, photonic applications, and optoelectronic applications. Moreover, the substrate support may comprise materials including but not limited to conductor materials, semiconductor materials and dielectric materials.

Within more particularly the context of biochemical applications and biotechnological applications, the substrate support typically comprises a solid substrate support of any thickness, as well as area dimensions that may be appropriate for a particular biochemical application or a particular biotechnological application.

The next diagram within the process flow schematic cross-sectional diagram of FIG. 4 shows the results of coating a hydrogel material composition layer (i.e., designated as gel) in accordance with the embodiments upon the substrate support. The coating of the hydrogel material composition layer upon the substrate support as illustrated within the uppermost diagram of the process flow schematic cross-sectional diagram of FIG. 4 to provide the second uppermost diagram within the process flow schematic cross-sectional diagram of FIG. 4 may be effected using any of several coating methods as are otherwise generally conventional in the relevant coating art. Such coating methods may include, but are not necessarily limited to, spray coating methods, dip coating methods, roller coating methods and transfer coating methods. Typically and preferably, the hydrogel material composition layer is coated upon the substrate support as is illustrated in process flow schematic diagram of FIG. 4 uppermost diagram to provide the hydrogel material composition layer coated substrate support that is illustrated within the next uppermost diagram within the process flow schematic cross-sectional diagram of FIG. 4 while using a spray coating method (i.e., as a non-limiting example) that provides the hydrogel material composition layer having a layer thickness from about 1 to about 6000 microns.

Furthermore, additional specific methods for coating a hydrogel material composition layer can be applied for coating of conductive substrate support surfaces by, for example, electrochemical deposition. Contact of a conductive substrate support surface with a solution comprising an alginate (or related cross-linking polymer) material, an α-hydroxy-carboxylate material and an iron (II) cation material and application of a positive electric potential to the conductive substrate support surface and a negative electric potential to another electrode immersed into the foregoing solution causes an electrochemical oxidation of iron (II) cations to iron (III) cations resulting in formation of a layer of iron (III) cation cross-linked alginate (or other cross-linking polymer) hydrogel material composition layer with a thickness from about 150 nanometers to about 100 micrometers.

The third uppermost and next diagram within the process flow schematic cross-sectional diagram of FIG. 4 shows the results of photoirradiating the hydrogel material composition layer located and formed upon the substrate support while using a suitable mask, in conjunction with radiation in the ultraviolet or the visible wavelength ranges, as described above within the context of the description of FIG. 1. Within the context of the embodiments, the photoirradiation is intended to provide radiation that is absorbed by the iron (III) cation material, and to that end, the ultraviolet or visible radiation is intended to be in a range from about 350 to about 450 nanometers. Within the context of a hydrogel material composition layer as described above, a dose of radiation in the visible or ultraviolet region is typically from about 10 to about 50 joules per cubic centimeter of the hydrogel material composition layer or structure volume.

The lowermost and next diagram within the process flow schematic cross-sectional diagram of FIG. 4 shows the results of development of the photoirradiated hydrogel material composition layer located and formed upon the substrate support with an aqueous developer to provide a patterned hydrogel material composition layer. Within the context of the embodiments, the aqueous developer may comprise pure water, or alternatively the aqueous developer may comprise an aqueous solution with an additional co-solvent or aqueous solution additives such as but not limited to surfactants and surfactant stabilizers. Typically, in accordance with the embodiments, the aqueous solution developer uses water and a surfactant at a temperature from about 0 to about 40 degrees Celsius for a time period from about 0.1 to about 20 minutes and more preferably from about 0.5 to about 5 minutes, to provide the patterned hydrogel material composition layer structure of the lowermost diagram that is illustrated in FIG. 4 from the third uppermost diagram that is illustrated in FIG. 4.

As is understood by a person skilled in the art, the remaining photoirradiation degradable patterned hydrogel material composition layer located and formed upon the substrate support as illustrated within the lowermost diagram within the process flow schematic cross-sectional diagram of FIG. 4, or alternatively a part of that layer, may be inhibited from further undesired degradation by light, heat or chemical reagents through treatment with a salt of a divalent or a trivalent metal cation that is not photoirradiation active. Such non-photoirradiation active divalent or trivalent metal cations may include, but are not limited to calcium (II) (i.e., $Ca^{2+}$), barium (II) (i.e., $Ba^{2+}$), magnesium (II) (i.e., $Mg^{2+}$), aluminum (III) (i.e., $Al^{3+}$) and chromium (III) (i.e., $Cr^{3+}$) divalent and trivalent metal cations. Such a replacement cation treatment partially or completely replaces iron (III) cations with other of the foregoing replacement metal cations that do not undergo a photoinduced reduction/oxidation reaction.

Such replacement of cations within the patterned hydrogel material composition layer that is illustrated within the lowermost diagram within the process flow schematic cross-sectional diagram of FIG. 4 may be effected by a repeating photoinduced or selective chemical degradation treatment of the remaining iron (III) cation cross-linked alginate hydrogel material composition layer that does not remove the remaining components of the patterned hydrogel material composition layer.

FIG. 4 thus generally shows a series of schematic cross-sectional diagrams that illustrate the results of progressive stages in forming a patterned hydrogel material composition layer upon a substrate support in accordance with the embodiments. Within the schematic cross-sectional diagram of FIG. 4, the photolithographic method for forming the patterned hydrogel material composition layer results from a photoinduced reduction/oxidation reaction between an iron (III) cation component within a hydrogel material composition layer in accordance with the embodiments and an alginate (or other cross-linking polymer) material composition in accordance with the embodiments or an alternative α-hydroxy-carboxylate molecule material. As is understood by a person skilled in the art, the process sequence that is illustrated within the schematic cross-sectional diagram of FIG. 4 shows in general a patterning sequence wherein the hydrogel material composition acts as a positive photoresist material (i.e., a portion of the hydrogel material composition that is exposed is removed when developed).

As is understood by a person skilled in the art, the embodiments also contemplate that a hydrogel material composition layer in accordance with the embodiments may also be used within the context of a negative imaging application with certain modifications of the processing sequence that is illustrated within the schematic cross-sectional diagram of FIG. 4.

To that end, one may start with the third uppermost diagram within the process flow schematic cross-sectional diagram that is illustrated in FIG. 4, and rather than directly develop the photoirradiated hydrogel material composition layer to provide the positive image as illustrated in FIG. 4, lowermost diagram, first ion exchange the iron (II) cations within the photoirradiated hydrogel material composition which are labile in comparison with the remaining iron (III) cations in the non-photoirradiated hydrogel material composition that are comparatively inert to ion exchange. The resulting ion exchanged hydrogel material composition layer then includes the photoirradiation inert cation cross-linked portion that is surrounded by the iron (III) cation portion which is photoirradiation active. This particular composition is then blanket photoirradiated to reduce the iron (III) crosslinked portion to an iron (II) crosslinked portion while the photoirradiation inert cation portion remains absent further reaction. Finally, the iron (II) cross-linked portion may be developed away in an aqueous developer to provide remaining the photoirradiation inert cation cross-linked portion which now serves as a negative image.

Thus, in accordance with the foregoing photolithographic methodology, the embodiments may be adapted to either a positive photolithographic processing sequence of a negative photolithographic processing sequence when using as a hydrogel material composition in accordance with the embodiments. As well, and in accordance with the Examples that follow, the embodiments also contemplate photoirradiation induced hydrogel material composition degradation and release of entrapped materials and components within bulk hydrogel material compositions, or layers thereof, or from surfaces of bulk hydrogel material compositions or layers thereof, in accordance with the embodiments.

Figure 5:
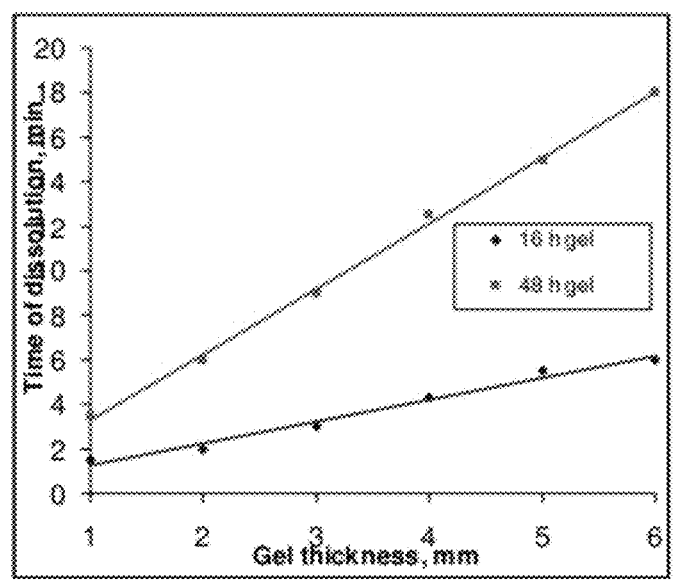
FIG. 5 shows a graph of Dissolution Time versus Thickness as a function of oxidation time for dissolving an iron (III) cation cross-linked alginate hydrogel material composition layer in accordance with the embodiments.

For reference purposes, FIG. 5 shows a graph of Dissolution Time versus Hydrogel Layer Thickness as a function of hydrogel material composition layer oxidation time for complete dissolution of an iron (III) cation cross-linked alginate hydrogel material composition layer in a 20 mM sodium lactate solution.

IV. EXPERIMENTAL EXAMPLES

1. Example 1

Preparation of Hydrogel Material Composition: an Aqueous Solution of Rhodamine stained serum bovine albumin in 1% sodium alginate was added dropwise through a syringe to an aqueous 1% solution of iron (III) chloride under gentle stirring. The resultant dark rose beads that formed in the iron (III) chloride solution after 2 minutes were separated, washed with distilled water, and then stored in water.

Photoirradiation Induced Degradation of Hydrogel Material Composition: The resultant dark rose beads were placed into a pH 7.0 20 mM solution of sodium lactate and irradiated by a UV lamp for 10 min. The irradiation resulted in dissolution of beads and release of the rhodamine stained albumin into aqueous solution.

2. Example 2

Preparation of Hydrogel Material Composition: To an aqueous 2% solution of sodium alginate was added an aqueous 400 mM solution of sodium lactate and then under stirring was added an aqueous solution of iron (II) chloride. The resultant pale yellow viscous solution was solidified in a Petri dish within 1-5 h, and on contact with air provided a clear yellow hydrogel material composition.

Figure 6:
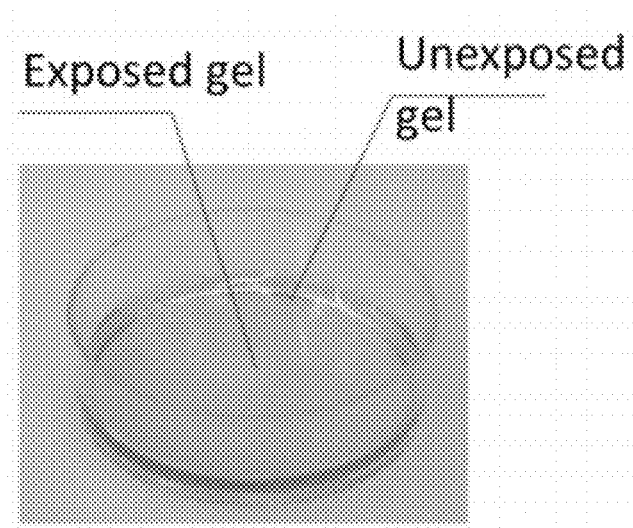
FIG. 6 shows a partially photoirradiated and partially photodeveloped iron (III) cation cross-linked alginate hydrogel material composition in accordance with the embodiments.

Photoirradiation Induced Degradation of Hydrogel Material Composition: The resultant hydrogel material composition was irradiated through an aluminum foil mask with violet laser λ=406 nm for 90 seconds. The resultant hydrogel material composition was treated with water for 10 min resulting is dissolution of the photoirradiation exposed parts of the hydrogel material composition and leaving the remaining hydrogel material composition intact. FIG. 6 shows a photographic image of the resulting photoirradiated and developed hydrogel material composition.

3. Example 3

Preparation of Hydrogel Material Composition: To a 1% aqueous solution of iron (III) chloride was added dropwise a solution of stabilized gold nanoparticles in 1% alginate gel. The resultant iron (III) cross-linked alginate hydrogel material composition beads were treated with iron (III) chloride for 2 min, separated, washed with water, and stored in water.

Figure 7:
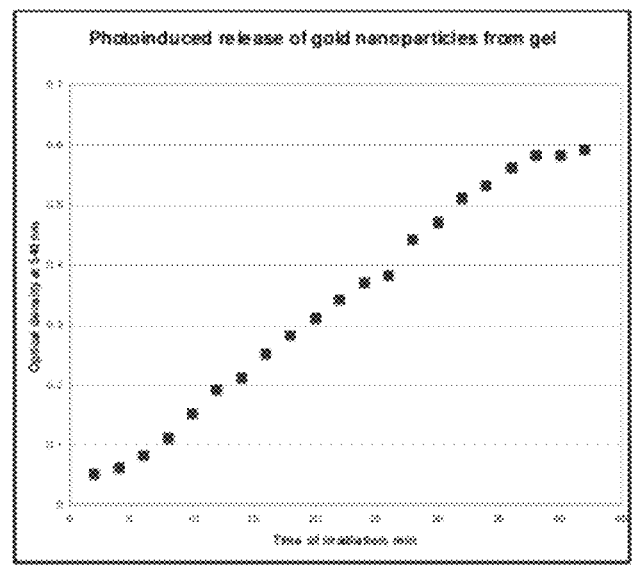
FIG. 7 shows a graph of Optical Density at 540 nm versus Irradiation Time for photoirradiation induced release of gold nanoparticles from a gold nanoparticle doped iron (III) cation cross-linked alginate hydrogel material composition in accordance with the embodiments.

Photoirradiation Induced Degradation of Hydrogel Material Composition: The iron (III) cross-linked alginate hydrogel material composition beads containing gold nanoparticles in pH 7.0 20 mM solution of sodium lactate were irradiated with long wave UV lamp irradiation. The release was monitored by UV absorption at 540 nm. A graph of the resulting UV absorption at 540 nm is shown in FIG. 7.

4. Example 4

Coating of Conductive Surface with the Hydrogel Material Composition: A sample of graphite surface was immersed into an electrochemical cell containing an aqueous solution of 1.2% sodium alginate, 0.6% iron (II) sulfate, 15% sodium sulfate and 0.01% rhodamine stained bovine serum albumin. An electric current was passed for 5 min through the system using the graphite surface as an anode under potentiostatic conditions with +0.8 V potential. The obtained 1 micrometer film of iron (III) cation cross-linked alginate hydrogel material composition located and formed on the graphite surface was washed with a large amount of water.

All references, including publications, patent applications, and patents cited herein are hereby incorporated by reference in their entireties to the extent allowed, and to the same extent as if each reference was individually and specifically indicated to be incorporated by reference and was set forth in its entirety herein.

The use of the terms "a," "an" and "the" and similar referents within the context of describing the invention (especially in the context of the following claims) is to be construed to cover both the singular and the plural, unless otherwise indicated herein or clearly contradicted by context.

The terms "comprising," "having," "including," and "containing" are to be construed as open-ended terms (i.e., meaning "including, but not limited to,") unless otherwise noted.

The term "connected" is to be construed as partly or wholly contained within, attached to, or joined together, even if there is something intervening.

The recitation of ranges of values herein is merely intended to serve as a shorthand method of referring individually to each separate value falling within a range, unless otherwise indicated herein, and each separate value is incorporated into the specification as if it was individually recited herein.

All methods described herein can be performed in any suitable order unless otherwise indicated herein or otherwise clearly contradicted by context.

The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A dissolvable hydrogel composition comprising:
   a cross-linking polymer material, wherein the cross-linking polymer material is selected from the group consisting of alginate, polyacrylate, polyvinyl alcohol, agarose, carboxymethylchitin, pectin, and combinations thereof;
   an α-hydroxy-carboxylate material; and
   an iron (III) cation cross-linker, wherein the iron (III) cation cross-linker forms a cross-linking complex with the cross-linking polymer material;
   wherein at least some of the iron (III) cation material is reduced in response to exposure of the dissolvable hydrogel composition to photoirradiation such that dissolution of said hydrogel is accelerated in response to exposure to the photoirradiation; and
   wherein the α-hydroxy-carboxylate material comprises a single carboxylic group separated from the hydroxy group by three or fewer covalent bonds.

2. The material composition of claim 1 wherein the material composition further comprises living cells.

3. The material composition of claim 1 wherein the material composition further comprises a virus.

4. The material composition of claim 1 wherein the material composition further comprises a biopolymer.

5. The material composition of claim 1 wherein:
   the cross-linking polymer material comprises from about 1 to about 4 weight percent of an aqueous solution material composition;
   the α-hydroxy-carboxylate material comprises from about 0.5 to about 10 weight percent of the aqueous solution material composition; and
   the iron (III) cation cross-linker comprises from about 0.5 to about 5 weight percent of the aqueous solution material composition.

6. A dissolvable hydrogel composition comprising:
   an alginate polymer material;
   an α-hydroxy-carboxylate material; and
   an iron (III) cation cross-linker, wherein the iron (III) cation cross-linker forms a cross-linking complex with the cross-linking polymer material;
   wherein at least some of the iron (III) cation material is reduced in response to exposure of the dissolvable hydrogel composition to photoirradiation such that dissolution of said hydrogel is accelerated in response to exposure to the photoirradiation;
   wherein the α-hydroxy-carboxylate material comprises a single carboxylic group separated from the hydroxy group by three or fewer covalent bonds.

* * * * *